*(12)* United States Patent
Sato et al.

(10) Patent No.: US 10,476,274 B2
(45) Date of Patent: Nov. 12, 2019

(54) SOLAR POWER GENERATION SYSTEM

(71) Applicant: TOYOTA JIDOSHA KABUSHIKI KAISHA, Toyota-shi, Aichi-ken (JP)

(72) Inventors: Daisuke Sato, Toyota (JP); Takahiro Hirano, Toyota (JP); Tatsuya Miyoshi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 180 days.

(21) Appl. No.: 15/835,715

(22) Filed: Dec. 8, 2017

(65) Prior Publication Data

US 2018/0166882 A1 Jun. 14, 2018

(30) Foreign Application Priority Data

Dec. 12, 2016 (JP) .................................. 2016-240478

(51) Int. Cl.
*H02J 3/38* (2006.01)
*G05F 1/67* (2006.01)
(Continued)

(52) U.S. Cl.
CPC ................ *H02J 3/383* (2013.01); *G05F 1/67* (2013.01); *H01L 27/142* (2013.01);
(Continued)

(58) Field of Classification Search
None
See application file for complete search history.

(56) References Cited

U.S. PATENT DOCUMENTS

| 8,359,176 B2* | 1/2013 | Fornage | G05F 1/67 |
| | | | 324/713 |
| 2012/0262949 A1* | 10/2012 | Han | H02J 3/385 |
| | | | 363/16 |
| 2013/0041511 A1 | 2/2013 | Kohno et al. | |

FOREIGN PATENT DOCUMENTS

| JP | 2004-280220 A | 10/2004 |
| JP | 2011-249790 A | 12/2011 |

(Continued)

OTHER PUBLICATIONS

Murzata, "A maximum power point tracking technique based on bypass diodemechanism for PV arrays under partial shading" Energy and Buildings 73 (2014) 13-25 (Year: 2014).*

(Continued)

*Primary Examiner* — Devina Pillay
(74) *Attorney, Agent, or Firm* — Oliff PLC

(57) ABSTRACT

A solar power generation system includes a solar module, a power converter, and a control device. The power converter is configured to control an output voltage of the solar module such that the output voltage matches a target output voltage. The control device is configured to determine a lower limit value of the target output voltage based on the following general formula.

$$V_{TL}(I_{rr}, T) = V_{OC}(I_{rr}, T) \cdot \frac{n-1}{n} - V_{BD}(T) - \alpha \qquad (1)$$

In the general formula, $I_{rr}$ denotes a used light intensity, and T denotes a temperature. $V_{TL}(I_{rr}, T)$ denotes the lower limit value of the target output voltage. $V_{OC}(I_{rr}, T)$ denotes an open-circuit voltage of the solar module. The number of the solar cells connected in series is denoted by n. $V_{BD}(T)$ (Continued)

denotes a positive value of a reverse breakdown voltage of one solar cell. A tolerable error is denoted by α.

4 Claims, 7 Drawing Sheets

(51) Int. Cl.
*H02S 40/36* (2014.01)
*H01L 27/142* (2014.01)
*H01L 31/02* (2006.01)
*H02J 7/35* (2006.01)

(52) U.S. Cl.
CPC .......... *H01L 31/02021* (2013.01); *H02J 7/35* (2013.01); *H02S 40/36* (2014.12); *Y02E 10/58* (2013.01)

(56) References Cited

FOREIGN PATENT DOCUMENTS

| | | |
|---|---|---|
| JP | WO2011/122165 A1 | 7/2013 |
| JP | 2013-157458 A | 8/2013 |
| JP | 2015-197870 A | 11/2015 |
| KR | 10-2014-0127933 A | 11/2014 |

OTHER PUBLICATIONS

Murtaza, Ali et al., "A maximum power point tracking technique based on bypass diode mechanism for PV arrays under partial shading.", Energy and Buildings, vol. 73, pp. 13-25, (2014).

* cited by examiner

SOLAR POWER GENERATION SYSTEM

INCORPORATION BY REFERENCE

The disclosure of Japanese Patent Application No. 2016-240478 filed on Dec. 12, 2016 including the specification, drawings and abstract is incorporated herein by reference in its entirety.

BACKGROUND

1. Technical Field

The present disclosure relates to a solar power generation system.

2. Description of Related Art

A solar power generation system is disclosed in Japanese Unexamined Patent Application Publication No. 2004-280220 (JP 2004-280220 A). The solar power generation system disclosed in JP 2004-280220 A has a solar module, a power conversion circuit, a control circuit, and a load. The solar module is configured by arranging a plurality of solar cells having a predetermined electromotive force into an array.

In the solar module in which the solar cells are connected in series, a shaded solar cell acts as a load in an electric circuit and consumes power. Consequently, the shaded solar cell may abnormally generate heat. A solar module that uses a bypass diode is known to prevent abnormal heat generation. For example, a solar module in which a bypass diode is connected in parallel with a plurality of solar cells is disclosed in Japanese Unexamined Patent Application Publication No. 2011-249790 (JP 2011-249790 A).

SUMMARY

When the bypass diode has an open fault, a current flows in a shaded solar cell and causes abnormal heat generation. In the present technical field, it is desirable to provide a solar power generation system that can reduce abnormal heat generation of a solar cell by control.

An aspect of the present disclosure relates to a solar power generation system including a solar module in which a plurality of solar cells are connected in series, a power converter connected to the solar module, and a control device configured to determine a target output voltage. The power converter is configured to control an output voltage of the solar module such that the output voltage matches a target output voltage. The control device is configured to determine a lower limit value of the target output voltage based on the following general formula.

$$V_{TL}(I_{rr}, T) = V_{OC}(I_{rr}, T) \cdot \frac{n-1}{n} - V_{BD}(T) - \alpha \quad (1)$$

In the general formula, $I_{rr}$ denotes a used light intensity, and T denotes a temperature. $V_{TL}(I_{rr}, T)$ denotes the lower limit value of the target output voltage under a certain used light intensity and a certain temperature. $V_{OC}(I_{rr}, T)$ denotes an open-circuit voltage of the solar module under a certain used light intensity and a certain temperature. The number of solar cells connected in series is denoted by n. $V_{BD}(T)$ denotes a positive value of a reverse breakdown voltage of one of the solar cells at a certain temperature. A tolerable error is denoted by $\alpha$.

The aspect of the present disclosure achieves setting the lower limit value of the target output voltage by using General Formula (1). When the target output voltage is below the lower limit value set by using General Formula (1) with at least a part of the solar cells shaded, the shaded solar cell is conducted in a reverse breakdown state. In such a case, the shaded solar cell consumes power and generates heat. The solar cell can be prevented from being conducted in a reverse breakdown state by setting the lower limit value of the target output voltage using General Formula (1). Thus, the solar power generation system can reduce abnormal heat generation of the solar cells by control.

In the solar power generation system according to the aspect of the present disclosure, the control device may be configured to determine whether or not at least a part of the solar cells is shaded. In such a case, the control device may be configured to set the lower limit value of the target output voltage when the control device determines that at least a part of the solar cells is shaded.

The aspect of the present disclosure enables setting the lower limit value of the target output voltage when the control device determines that at least a part of the solar cells is shaded, that is, when there is a possibility of satisfying an abnormal heat generation condition.

The solar power generation system according to the aspect of the present disclosure may further include a first diode and a second diode. In such a case, the solar cells may include a first series solar cell group and a second series solar cell group. The first diode and the first series solar cell group may be connected in parallel with each other. The second diode and the second series solar cell group may be connected in parallel with each other. The control device may be configured to determine whether or not at least one of the first diode and the second diode has an open fault. The control device may be configured to set the lower limit value of the target output voltage when the control device determines that at least one of the first diode and the second diode has an open fault.

The aspect of the present disclosure enables setting the lower limit value of the target output voltage when the control device determines that at least one of the first diode and the second diode has an open fault, that is, when there is a possibility of satisfying the abnormal heat generation condition.

The solar power generation system according to the aspect of the present disclosure may further include an imaging device configured to acquire a captured image of a surface of the solar cells. The control device may be connected with the imaging device and may be configured to determine whether or not at least a part of the solar cells is shaded, based on the image acquired by the imaging device.

The present disclosure enables reducing abnormal heat generation of solar cells by control.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Hereinafter, embodiments of the present disclosure will be described with reference to the drawings. In the following description, the same or corresponding elements will be designated by the same reference signs and will be described once.

First Embodiment

Configuration of Solar Power Generation System 100

Figure 1:
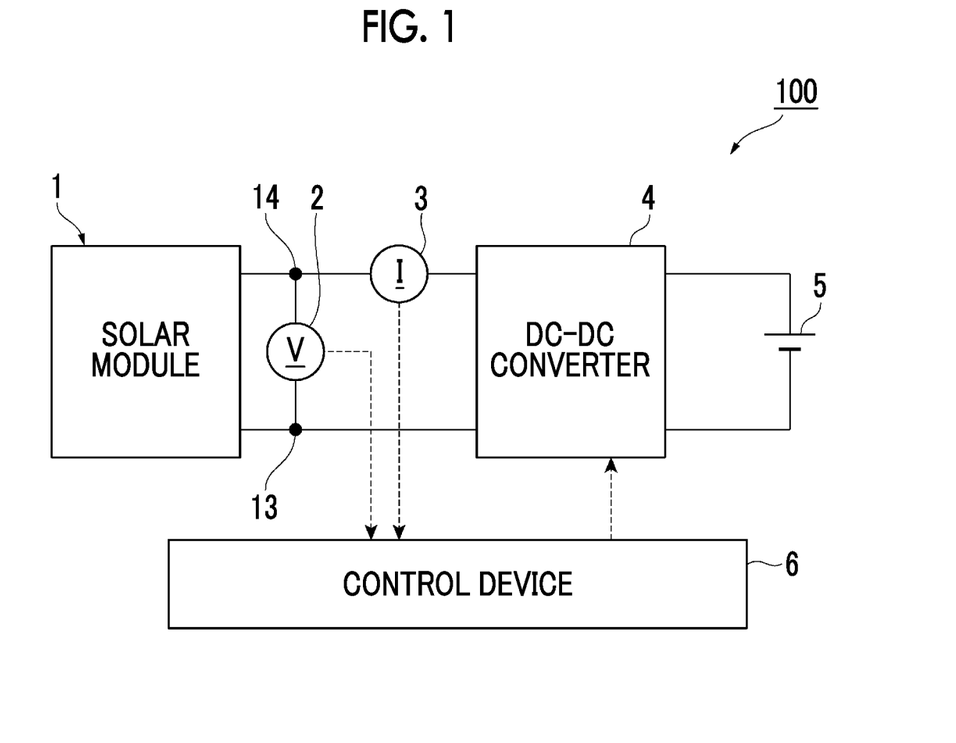
FIG. 1 is a block diagram illustrating a solar power generation system according to a first embodiment.
Figure 2:
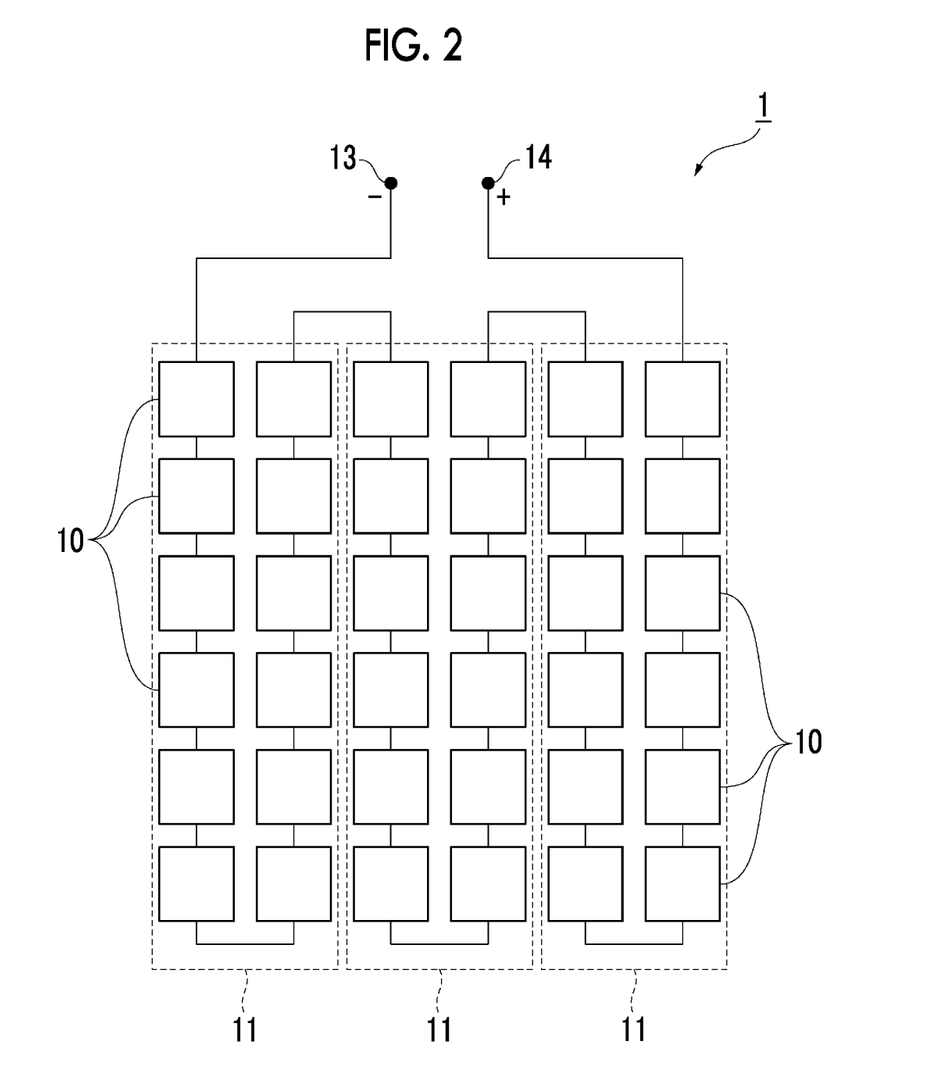
FIG. 2 is a plan view illustrating a solar module in FIG. 1.

FIG. 1 is a block diagram illustrating a solar power generation system 100 according to a first embodiment. FIG. 2 is a plan view illustrating a solar module 1 in FIG. 1. The solar power generation system 100 is a system that generates power by using sunlight and stores the power. As illustrated in FIG. 1 and FIG. 2, the solar power generation system 100 includes the solar module 1, a voltmeter 2, an ammeter 3, a DC-DC converter 4 (one example of a power converter), a storage battery 5, and a control device 6.

The solar module 1 is a component configured by combining a plurality of elements generating power by using sunlight into a unit. The solar module 1 outputs power. The solar module 1 has a plurality of solar cells 10 and output terminals 13, 14.

Each solar cell 10 is an energy conversion element. When each solar cell 10 receives sunlight on a light reception surface thereof, each solar cell 10 converts the energy of the received sunlight into power and outputs the power. Each solar cell 10 is not limited to a specific configuration and employs a known solar cell.

The solar cells 10 have the same configuration and are connected in series. That is, the solar cells 10 are electrically connected to each other in series. The solar cells 10 form a plurality of series solar cell groups 11. The series solar cell groups 11 are connected in series. In the present embodiment, the solar cells 10 form three series solar cell groups 11. Specifically, the total number of solar cells 10 is 36, and the number of solar cells 10 forming each series solar cell group 11 is 12.

The output terminal 13 is a terminal that is disposed at a low electric potential power output end of the solar module 1. The output terminal 13 is electrically connected to, for example, a low electric potential power input terminal of the DC-DC converter 4. The output terminal 14 is a terminal that is disposed at a high electric potential power output end of the solar module 1. The output terminal 14 is electrically connected to, for example, a high electric potential power input terminal of the DC-DC converter 4.

The voltmeter 2 is a meter that measures a voltage (difference in electric potential) in an electric circuit. The voltmeter 2 is connected in parallel with the solar module 1. More specifically, the voltmeter 2 is electrically connected between the output terminal 13 and the output terminal 14 of the solar module 1 and measures a voltage output by the solar module 1. The ammeter 3 is a meter that measures a current in an electric circuit. The ammeter 3 is connected in series with the solar module 1. More specifically, the ammeter 3 is electrically connected to the output terminal 14 of the solar module 1 and measures a current output from the solar module 1.

The DC-DC converter 4 is a device that converts power. The DC-DC converter 4 is connected to the solar module 1. In FIG. 1, the DC-DC converter 4 is electrically connected between the solar module 1 and the storage battery 5. The DC-DC converter 4 controls the output voltage of the solar module 1 such that the output voltage matches a target output voltage. The output voltage that is controlled to match the target output voltage is converted into a predetermined voltage by the DC-DC converter 4. More specifically, the DC-DC converter 4 converts the voltage and the current output by the solar module 1 and outputs the converted voltage and the converted current to the storage battery 5. The DC-DC converter 4 is not limited to a specific configuration and employs a known DC-DC converter.

The storage battery 5 is a battery that can be charged with power input from the solar module 1. The storage battery 5 is not limited to a specific battery and may be any battery that can be charged and discharged repeatedly.

The control device 6 is a calculation device and is configured as a general computer including, for example, a central processing unit (CPU), a read-only memory (ROM), and a random access memory (RAM). The control device 6 is connected to the DC-DC converter 4 and controls operation of the DC-DC converter 4. Specifically, the control device 6 determines the target output voltage of the DC-DC converter 4.

The control device 6, for example, determines a target output voltage that achieves the maximum output power of the solar module 1. The control device 6 can employ various known methods. For example, the control device 6 controls the operation of the DC-DC converter 4 such that a maximum power point tracking (MPPT) control is executed in the solar power generation system 100. The MPPT control is a control method that changes the output voltage of the solar module 1, compares power before and after the change in the voltage, and employs a voltage which achieves more power. More specifically, the control device 6 calculates the power generated by the solar module 1 based on the voltage measured by the voltmeter 2 and the current measured by the ammeter 3.

The control device 6 sets a lower limit value of the target output voltage by using General Formula (1).

$$V_{TL}(I_{rr}, T) = V_{OC}(I_{rr}, T) \cdot \frac{n-1}{n} - V_{BD}(T) - \alpha \quad (1)$$

In the general formula, $I_{rr}$ denotes a used light intensity, and T denotes a temperature. $V_{TL}(I_{rr}, T)$ denotes the lower limit value of the target output voltage under a certain used light intensity and a certain temperature. $V_{OC}(I_{rr}, T)$ denotes an open-circuit voltage of the solar module 1 under a certain used light intensity and a certain temperature. The number of solar cells connected in series is denoted by n. $V_{BD}(T)$ denotes a positive value of a reverse breakdown voltage of one of the solar cells at a certain temperature. A tolerable error is denoted by α. The reason for employing such a lower limit value is to prevent generation of heat by the solar cell 10 that is shaded. Details will be described below.

The open-circuit voltage $V_{OC}$ of the solar module 1 is measured by a measurement method defined in, for example, IEC60904-1 that is an International Electrotechnical Commission (IEC) standard. The open-circuit voltage $V_{OC}$ depends on the used light intensity. The open-circuit voltage $V_{OC}$ used in General Formula (1) may be, for example, the open-circuit voltage of the solar module 1 (the open-circuit voltage between the output terminal 13 and the output terminal 14) when the solar module 1 receives sunlight corresponding to an upper limit of the used light intensity (the light intensity when the solar module 1 is in use). More specifically, a specific range of the upper limit value of the used light intensity is, for example, 300 W/m² to 1,000 W/m². The open-circuit voltage $V_{OC}$ of the solar module 1 depends on the temperature. For example, the open-circuit voltage $V_{OC}$ of the solar module 1 has temperature dependence such that the open-circuit voltage $V_{OC}$ rises in proportion to a decrease in the temperature of each solar cell 10. The open-circuit voltage $V_{OC}$ used in General Formula (1) may be the open-circuit voltage of the solar module 1 at a lower limit temperature of each solar cell 10 in use. A specific temperature range of the lower limit temperature is −30° C. to 90° C.

The reverse breakdown voltage $V_{BD}$ of each solar cell 10 is defined based on a current-voltage characteristic of each solar cell 10. The reverse breakdown voltage $V_{BD}$ depends on the temperature. For example, the reverse breakdown voltage $V_{BD}$ has temperature dependence such that the reverse breakdown voltage $V_{BD}$ is decreased in proportion to a decrease in the temperature of each solar cell 10. The reverse breakdown voltage $V_{BD}$ of each solar cell 10 may be the reverse breakdown voltage of the solar module 1 at the lower limit temperature of each solar cell 10 in use. A specific temperature range of the lower limit temperature is −30° C. to 90° C. A method of defining the reverse breakdown voltage $V_{BD}$ of each solar cell 10 will be described in detail below.

The tolerable error a is represented by the product of a tolerable current $I_T$ and a parasitic series resistance R. The tolerable current $I_T$ is a current value that causes heat generation within a tolerable range when the current is conducted to the shaded solar cell 10 at a certain temperature. For example, the tolerable current $I_T$ is set such that a generated heat amount $V_{BD} \cdot I$ [W] at a current I falls within a tolerable range corresponding to heat resistance of the solar module 1. The amount of generated heat within the tolerable range is, for example, 20 W to 30 W. The parasitic series resistance R is the total parasitic series resistance of the solar module 1 and the path from the solar module 1 to a point at which the voltmeter 2 is connected.

The control device 6 sets the lower limit value to determine the target output voltage that is greater than or equal to the lower limit value. There are several methods of determining the target output voltage by using the lower limit value. As a first method, the control device 6 first sets a voltage range that is greater than or equal to the lower limit value, and determines the target output voltage within the set voltage range by using a known method. As a second method, the control device 6 first determines a tentative target output voltage by using a known method, and compares the determined tentative target output voltage with the lower limit value. When the determined tentative target output voltage is greater than or equal to the lower limit value, the control device 6 employs the determined tentative target output voltage as the target output voltage. When the determined tentative target output voltage is less than the lower limit value, the control device 6 discards the determined tentative target output voltage and compares the next available target output voltage with the lower limit value. The control device 6 repeats the process to determine the target output voltage.

The control device 6 outputs a control value corresponding to the determined target output voltage to the DC-DC converter 4. The control value is, for example, a duty cycle of the DC-DC converter 4.

Principle of Abnormal Heat Generation

A condition for having abnormal heat generation of each solar cell 10 will be described. When the solar module 1 does not have a bypass diode, the abnormal heat generation condition is established when two conditions are satisfied. A first condition is that a partial area or the entire area of the light reception surface of at least one solar cell 10 of the solar module 1 is shaded. Shade means shadow that is caused when sunlight is blocked in a circumstance having sunlight. A cause of blocking of sunlight for a part of the solar cells 10 is considered to be, for example, weather, adhesion of a blocking object such as droppings of birds, or damage or modification in a cell surface layer due to a collision of a flying object. When all of the solar cells 10 are shaded, abnormal heat generation is obviously not caused. The case where all of the solar cells 10 are shaded will be excluded from the following description.

When at least one solar cell 10 is shaded, the output current of the solar module 1 is limited to the current value of the shaded solar cell 10. A second condition is that the output voltage of the solar module 1 falls within a predetermined range. Hereinafter, the range of the output voltage of the solar module 1 causing abnormal heat generation will be described in detail.

Figure 3:
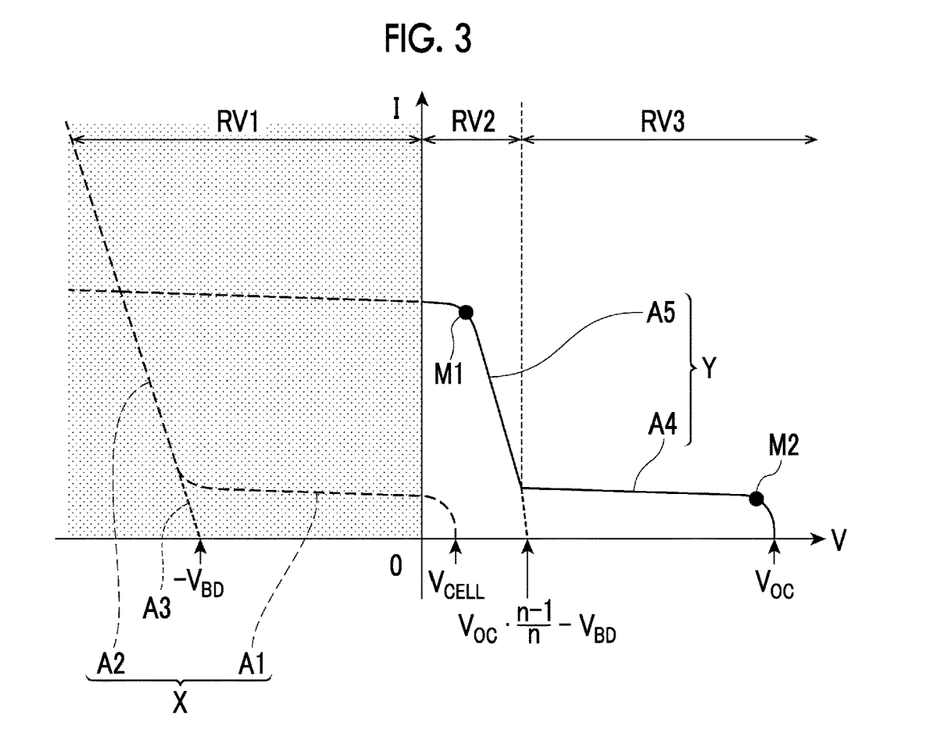
FIG. 3 is a graph illustrating a current-voltage characteristic of the solar module in FIG. 1.

FIG. 3 is a graph illustrating a current-voltage characteristic of the solar module 1 in FIG. 1. In FIG. 3, a horizontal axis denotes a voltage V output by the solar module 1, and a vertical axis denotes the current I output by the solar module 1. In a first quadrant (V>0 and I>0) in FIG. 3, the solar module 1 functions as a battery (forward bias). In a second quadrant (V<0 and I>0) in FIG. 3, the solar module 1 functions as a load (reverse bias).

A graph X in broken lines illustrates a current-voltage characteristic of one shaded solar cell 10 (a part or the entirety of the light reception surface of the solar cell 10 is shaded). The graph X intersects the horizontal axis at an open-circuit voltage $V_{CELL}$ of one solar cell 10. In the graph X, the current rises in proportion to a decrease in voltage. However, since the solar cell 10 is shaded, the solar cell 10 is saturated at a comparatively low current value (A1 in FIG. 3).

As illustrated in the graph X, the current is sharply and linearly increased (A2 in FIG. 3) when a reverse voltage is applied to the solar cell 10 (a first voltage range RV1 in FIG. 3) and is decreased to a predetermined value (the absolute value of the reverse voltage is increased to the predetermined value). The reverse breakdown voltage $V_{BD}$ of the solar cell 10 can be defined as a positive value of a voltage at a point where a line (A3 in FIG. 3) acquired by approximating the A2 part of the graph X with a straight line intersects the horizontal axis.

A graph Y in a solid line is a current-voltage characteristic of the solar module 1 that includes one shaded solar cell 10. Operation of the solar module 1 is controlled in the area of the first quadrant. The graph Y intersects the horizontal axis at the open-circuit voltage $V_{OC}$ of the solar module 1 having n solar cells 10. In the graph Y, the current rises in proportion to a decrease in the output voltage. However, since one solar cell 10 is shaded, the output current that can flow in the solar cell 10 is the upper limit of the output current. Consequently, the solar module 1 is saturated at a comparatively low current value (A4 and a third voltage range RV3 in FIG. 3).

As illustrated in the graph Y, the output current is sharply and linearly increased (A5 and a second voltage range RV2 in FIG. 3) when the reverse voltage applied to the shaded solar cell 10 is decreased to an output voltage acquired by subtracting the reverse breakdown voltage $V_{BD}$ from the output voltage corresponding to the open-circuit voltage of each of the (n−1) solar cells 10 (the absolute value of the reverse voltage is increased to a predetermined value). The second voltage range RV2 is represented in General Formula (2).

$$0 < V < V_{OC}(I_{rr}, T) \cdot \frac{n-1}{n} - V_{BD}(T) \qquad (2)$$

When the target output voltage of the solar module 1 is within the second voltage range RV2, the shaded solar cell 10 is conducted in a reverse breakdown state. In such a case, the solar cell 10 generates heat.

When the control device 6 determines the target output voltage by the MPPT control, a first power point M1 may be selected as the maximum output value. When the target output voltage is fixed within the second voltage range RV2 with the first power point M1 as a reference, the state of abnormal heat generation of the shaded solar cell 10 may continue. That is, the problem of abnormal heat generation of the solar cells 10 is more noticeable when the control device 6 determines the target output voltage by the MPPT control.

Lower Limit Value of Target Output Voltage

As described above, heat is generated when the target output voltage is set within the second voltage range RV2. The control device 6 sets the lower limit value of the target output voltage by using General Formula (1) to prevent the target output voltage from being set within the second voltage range RV2. Accordingly, the second condition which is the abnormal heat generation condition is not satisfied. In the example in FIG. 3, the first power point M1 is not selected, and a second power point M2 is selected. Accordingly, the solar power generation system 100 can reduce abnormal heat generation of the solar cells 10 by control.

In the description illustrating one shaded solar cell 10, when, for example, m (m is greater than or equal to two) solar cells 10 are shaded, a coefficient m is attached to $-V_{BD}$ in General Formula (1). The value of the left-hand side of General Formula (1) is further decreased. Accordingly, when General Formula (1) is satisfied in the description where one solar cell 10 is shaded, General Formula (1) is also satisfied when m solar cells 10 are shaded.

Lower Limit Value Setting Process of Solar Power Generation System 100

Figure 4:
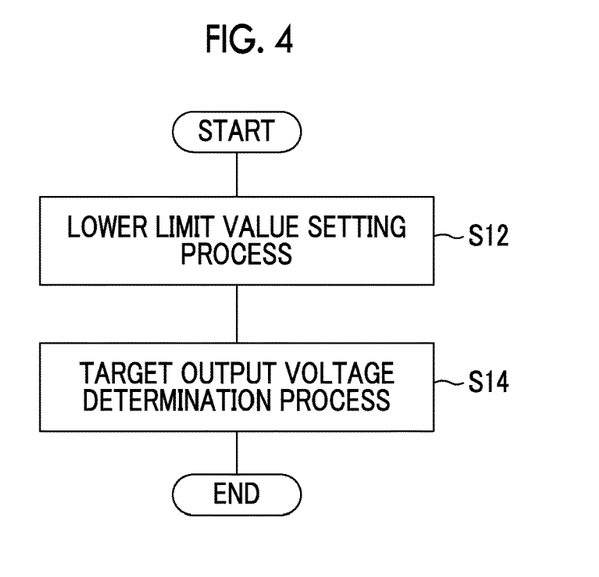
FIG. 4 is a flowchart describing an output determination process of the solar power generation system in FIG. 1.

FIG. 4 is a flowchart illustrating an output determination process of the solar power generation system 100. The flowchart illustrated in FIG. 4 is executed by the control device 6 when an output is acquired from the solar module 1.

As illustrated in FIG. 4, the control device 6 starts from a lower limit value setting process (S12). As the lower limit value setting process (S12), the control device 6 sets the lower limit value of the target output voltage. The control device 6 sets the lower limit value calculated by using General Formula (1) as the lower limit value of the target output voltage.

Next, as a target output voltage determination process (S14), the control device 6 determines the target output voltage within a range greater than or equal to the lower limit value set in the lower limit value setting process (S12) such that the maximum output is acquired from the solar module 1. The control device 6 determines the target output voltage that is used in, for example, the MPPT control. The control device 6 determines the target output voltage at a predetermined timing or cycle before an MPPT control termination condition such as switching a power source of the solar power generation system 100 OFF is satisfied, that is, during execution of the MPPT control. When the control device 6 terminates the target output voltage determination process (S14), the control device 6 terminates the flowchart of the output determination process illustrated in FIG. 4. The control device 6 may dynamically set the lower limit value of the target output voltage during execution of the MPPT control. Such a case is realized by the control device 6 repeatedly executing the lower limit value setting process (S12) and reflecting the lower limit value set at each moment on the target output voltage determination process (S14). The process heretofore sets the lower limit value of the target output voltage and determines the target output voltage that is greater than or equal to the lower limit value.

Modification Example 1

Figure 5:
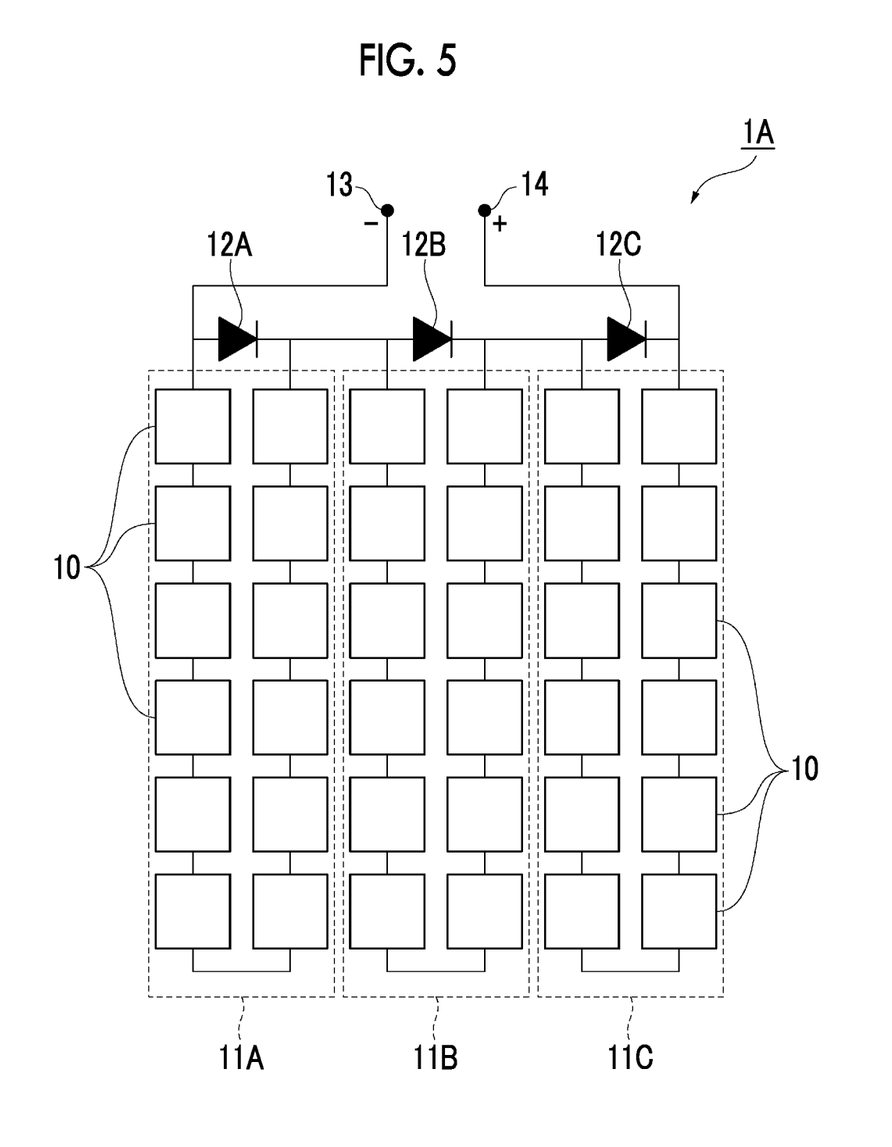
FIG. 5 is a plan view illustrating a solar module according to a modification example.

The solar module 1 may include a unit that bypasses the input and the output of the series solar cell group 11 in which a part of the solar module 1 is shaded. FIG. 5 is a plan view illustrating a solar module 1A according to Modification Example 1. As illustrated in FIG. 5, the solar module 1A has the same configuration as the solar module 1 except for including bypass diodes 12A to 12C. Hereinafter, the bypass diodes 12A to 12C may be collectively referred to as a bypass diode 12.

The solar cells 10 connected in series are divided into the series solar cell groups 11. In FIG. 5, the solar cells 10 connected in series are divided into a series solar cell group 11A (one example of a first series solar cell group), a series solar cell group 11B (one example of a second series solar cell group), and a series solar cell group 11C. Hereinafter, the series solar cell groups 11A to 11C may be collectively referred to as the series solar cell group 11.

The bypass diode 12 is an element that has a rectifying action. One bypass diode 12 is disposed for the series solar cell group 11. The bypass diode 12 is disposed to connect a high electric potential power output end and a low electric potential power output end of the series solar cell group 11. That is, the bypass diode 12 is connected in parallel with the series solar cell group 11 (electrically connected in parallel with each other). For example, the bypass diode 12A (one example of a first diode) is connected in parallel with the series solar cell group 11A. The bypass diode 12B (one example of a second diode) is connected in parallel with the series solar cell group 11B. The bypass diode 12C is connected in parallel with the series solar cell group 11C.

The bypass diode 12 is disposed to have a forward direction from the low electric potential power output end to the high electric potential power output end of the series solar cell group 11. When a predetermined or higher forward voltage is applied in the bypass diode 12, a current flows from the low electric potential power output end to the high electric potential power output end of the series solar cell group 11. Thus, when the solar cell 10 is shaded, the bypass diode 12 acts to bypass the current that cannot flow in the series solar cell group 11 including the solar cell 10. The control device 6 sets the lower limit value of the target output voltage. Thus, even when a part of the solar cells 10 is shaded with the bypass diode 12 having an open fault, abnormal heat generation of the solar cells 10 can be reduced.

Conclusion of First Embodiment

The solar power generation system 100 according to the first embodiment heretofore sets the lower limit value of the target output voltage by using General Formula (1). When the target output voltage is below the lower limit value set by using General Formula (1) with at least a part of the solar cells 10 shaded, the shaded solar cell 10 is conducted in a reverse breakdown state. In such a case, the shaded solar cell 10 consumes power and generates heat. The solar cell 10 can be prevented from being conducted in a reverse breakdown state by setting the lower limit value of the target output voltage using General Formula (1). Thus, the solar power generation system 100 can reduce abnormal heat generation of the solar cells 10 by control.

The problem of abnormal heat generation of the solar cells 10 is more noticeable when the control device 6 determines the target output voltage by the MPPT control. The solar power generation system 100 according to the first embodiment can reduce abnormal heat generation of the solar cells 10 by control even when the solar power generation system 100 determines the target output voltage by the MPPT control.

Second Embodiment

In the solar power generation system 100 according to the first embodiment, the control device 6 sets the lower limit value of the target output voltage at all times by using General Formula (1). However, when there is no shaded solar cell 10, abnormal heat generation is not caused even when the target output voltage that is less than or equal to the lower limit value set by using General Formula (1) is determined. Accordingly, provided that the lower limit value can be set when there is a possibility of having abnormal heat generation, a settable voltage range of the target output voltage can be enlarged when there is no possibility of having abnormal heat generation. Consequently, the total amount of power generated by the solar power generation system 100 may be increased. In a solar power generation system 100A according to a second embodiment, when there is a possibility of having abnormal heat generation, the target output voltage is determined after the lower limit value of the target output voltage is set. When there is no possibility of having abnormal heat generation, the target output voltage is determined without setting the lower limit value of the target output voltage.

Configuration of Solar Power Generation System 100A

Figure 6:
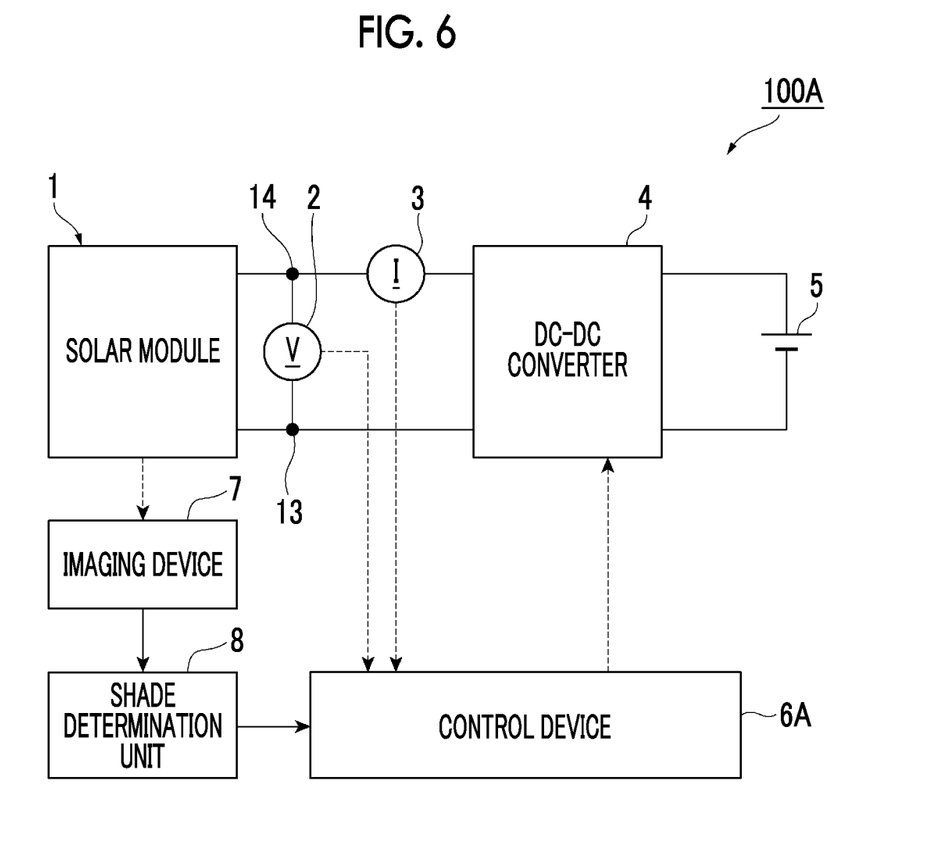
FIG. 6 is a block diagram illustrating a solar power generation system according to a second embodiment.

FIG. 6 is a block diagram illustrating the solar power generation system 100A according to the second embodiment. The solar power generation system 100A has the same configuration as the solar power generation system 100 according to the first embodiment except for including an imaging device 7 and a shade determination unit 8 and having a different function for a control device.

The imaging device 7 and the shade determination unit 8 are configured to be capable of exchanging information with each other. The control device 6A and the shade determination unit 8 are configured to be capable of exchanging information with each other. The method of exchanging information is not particularly limited. For example, the control device 6A and the shade determination unit 8 may be electrically connected through wiring or the like, may be connected to be capable of wireless communication or wired communication, or may be configured to be capable of referencing a shared external storage medium.

The imaging device 7 is a device that includes an imaging element. The imaging device 7 is disposed to acquire a captured image of the surface of the solar cells 10. The imaging device 7 is, for example, a camera.

The shade determination unit 8 is a calculation device and is configured as a general computer including, for example, a CPU, a ROM, and a RAM. The shade determination unit 8 acquires the image acquired by the imaging device 7. The shade determination unit 8 analyzes the image acquired by the imaging device 7 and determines whether or not at least a part of the solar cells 10 is shaded. The analysis method can employ a known image processing technology.

The control device 6A is the same as the control device 6 except for setting the lower limit value of the target output voltage when a condition is satisfied. The control device 6A acquires a determination result of the shade determination unit 8. When the shade determination unit 8 determines that at least a part of the solar cells 10 is shaded, the control device 6A sets the lower limit value of the target output voltage.

Lower Limit Value Setting Process of Solar Power Generation System 100A

Figure 7:
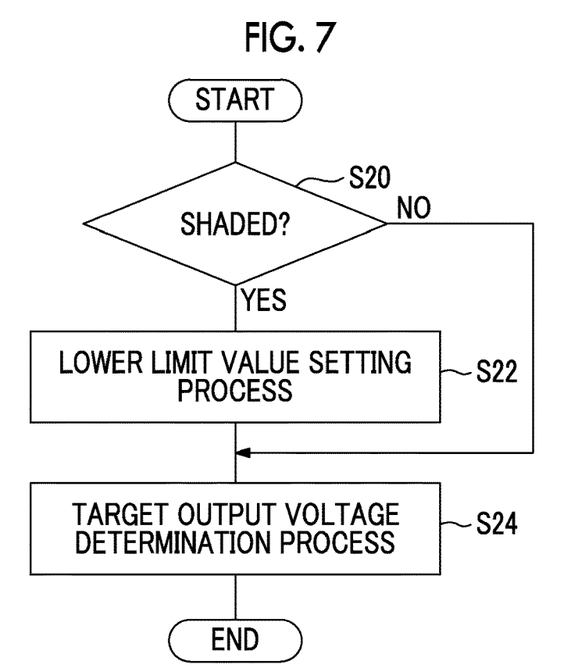
FIG. 7 is a flowchart describing a target output voltage determination process.

FIG. 7 is a flowchart illustrating an output determination process of the solar power generation system 100A. The flowchart illustrated in FIG. 7 is executed by the shade determination unit 8 and the control device 6A when an output is acquired from the solar module 1.

As illustrated in FIG. 7, the solar power generation system 100A starts from a shade determination process (S20). As the shade determination process (S20), the shade determination unit 8 determines whether or not at least a part of the solar cells 10 is shaded, based on the image acquired by the imaging device 7.

When the shade determination unit 8 determines that at least a part of the solar cells 10 is shaded (YES in S20), the control device 6A sets the lower limit value of the target output voltage as a lower limit value setting process (S22). The control device 6A sets the lower limit value calculated by using General Formula (1) as the lower limit value of the target output voltage. Next, a target output voltage determination process (S24) is executed.

As the target output voltage determination process (S24), the control device 6A determines the target output voltage within a range greater than or equal to the lower limit value set in the lower limit value setting process (S22) such that the maximum output is acquired from the solar module 1.

When the shade determination unit 8 does not determine that at least a part of the solar cells 10 is shaded (NO in S20), the control device 6A executes the target output voltage determination process (S24) without executing the lower limit value setting process (S22). As the target output voltage determination process (S24), the control device 6A determines the target output voltage without limitations on the voltage range such that the maximum output is acquired from the solar module 1.

The solar power generation system 100A terminates the flowchart of the output determination process illustrated in FIG. 7 when the target output voltage determination process (S24) is terminated. When the target output voltage is dynamically set, the solar power generation system 100A executes the terminated flowchart of the output determination process again from the beginning. The process heretofore sets the lower limit value of the target output voltage when there is a possibility of satisfying the abnormal heat generation condition, and determines the target output voltage that is greater than or equal to the lower limit value.

The solar power generation system 100A according to the second embodiment may employ Modification Example 1 according to the first embodiment.

Conclusion of Second Embodiment

The solar power generation system 100A according to the second embodiment heretofore sets the lower limit value of the target output voltage by using General Formula (1) when the shade determination unit 8 determines that at least a part of the solar cells 10 is shaded, that is, when there is a possibility of satisfying the abnormal heat generation condition. The solar power generation system 100A dynamically sets the lower limit value and thus, can reduce abnormal heat generation of the solar cells 10 by control and increase the total amount of power generated by the solar power generation system 100A.

Third Embodiment

In the solar power generation system 100 according to the first embodiment, the control device 6 sets the lower limit value of the target output voltage by using General Formula (1) even when the solar module 1A including the bypass diode 12 is employed. However, when the bypass diode 12 does not have an open fault, abnormal heat generation is not caused even when the target output voltage that is less than or equal to the lower limit value set by using General Formula (1) is determined. Accordingly, provided that the lower limit value can be set when there is a possibility of having abnormal heat generation, a settable voltage range of the target output voltage can be enlarged when there is no possibility of having abnormal heat generation. Consequently, the total amount of power generated by the solar power generation system 100 may be increased. In a solar power generation system 100B according to a third embodiment, when there is a possibility of having abnormal heat generation, the target output voltage is determined after the lower limit value of the target output voltage is set, in the same manner as the second embodiment. When there is no possibility of having abnormal heat generation, the target output voltage is determined without setting the lower limit value of the target output voltage.

Configuration of Solar Power Generation System 100B

Figure 8:
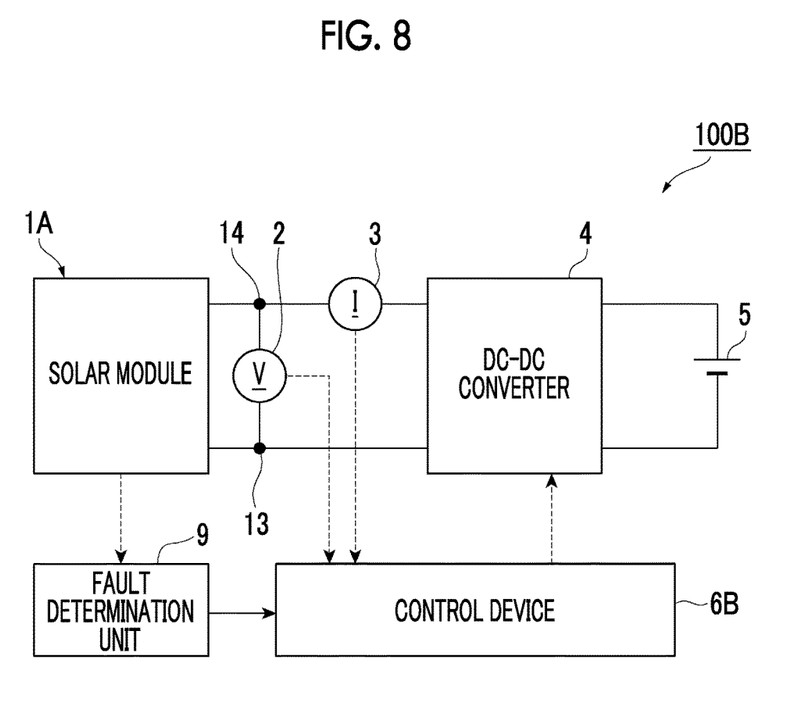
FIG. 8 is a block diagram illustrating a solar power generation system according to a third embodiment.

FIG. 8 is a block diagram illustrating the solar power generation system 100B according to the third embodiment. The solar power generation system 100B has the same configuration as Modification Example 1 (the example that includes the solar module 1A including the bypass diode 12) of the solar power generation system 100 according to the first embodiment except for including a fault determination unit 9 and having a different function for a control device.

The solar module 1A and the fault determination unit 9 are configured to be capable of exchanging information with each other. A control device 6B and the fault determination unit 9 are configured to be capable of exchanging information with each other. The method of exchanging information is not particularly limited. For example, the control device 6B and the fault determination unit 9 may be electrically connected through wiring or the like, may be connected to be capable of wireless communication or wired communication, or may be configured to be capable of referencing a shared external storage medium.

The fault determination unit 9 is a calculation device and is configured as a general computer including, for example, a CPU, a ROM, and a RAM. The fault determination unit 9 acquires measurement information from the solar module 1A in order to determine whether or not the bypass diode 12 has an open fault. One example of the measurement information is, for example, a current value and a voltage value flowing in the bypass diode 12.

The fault determination unit 9 may, for example, compare a current-voltage characteristic of the bypass diode 12 in normal operation with a current-voltage characteristic of the bypass diode 12 based on the measurement information to determine whether or not the bypass diode 12 has an open fault. Alternatively, the fault determination unit 9 may determine whether or not the bypass diode 12 has an open fault based on a current value that flows from a negative electrode to a positive electrode of the solar module 1A when a reverse voltage is applied to the solar module 1A.

Alternatively, the fault determination unit 9 may determine a fault by using a determination circuit that is disposed in the solar module 1A. The determination circuit is disposed for each series solar cell group 11 of the solar module 1A. That is, the fault determination unit 9 determines whether or not each bypass diode 12 has an open fault. The determination circuit includes a series circuit of an LED and an LED drive circuit, and a polarity switch. The series circuit is connected in parallel with the bypass diode 12 in the same forward direction. The polarity switch switches connection polarity between an anode side end and a cathode side end of the parallel circuit of the bypass diode 12 and the series circuit, and a positive electrode terminal and a negative electrode terminal that are externally connected. When the LED is turned off in a state of generating power by receiving sunlight and then, is turned on at the time of switching the polarity, the fault determination unit 9 determines that the bypass diode 12 has an open fault. Accordingly, the fault determination unit 9 determines whether or not at least one of the bypass diodes 12A to 12C has an open fault.

The control device 6B is the same as the control device 6 except for setting the lower limit value of the target output voltage when a condition is satisfied. The control device 6B acquires a determination result of the fault determination unit 9. When the fault determination unit 9 determines that at least one of the bypass diodes 12A to 12C has an open fault, the control device 6B sets the lower limit value of the target output voltage by using General Formula (1).

Lower Limit Value Setting Process of Solar Power Generation System 100B

Figure 9:
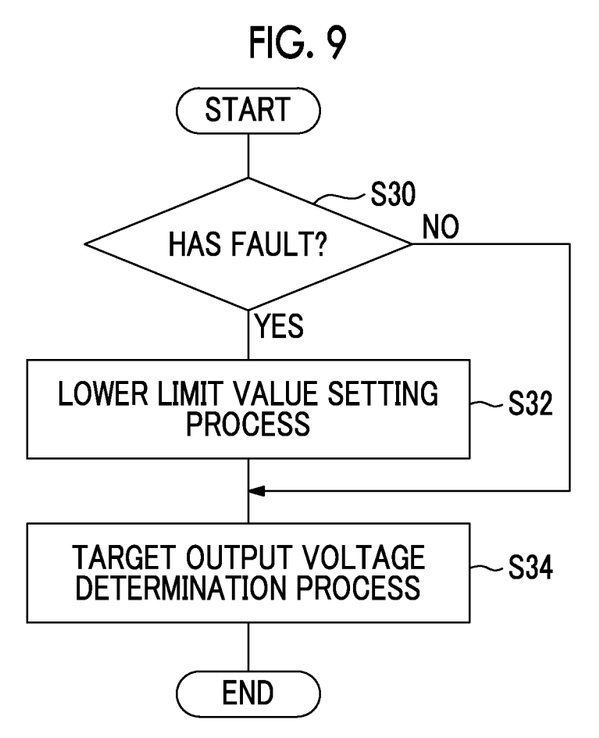
FIG. 9 is a flowchart describing a target output voltage determination process.

FIG. 9 is a flowchart illustrating an output determination process of the solar power generation system 100B. The flowchart illustrated in FIG. 9 is executed by the fault determination unit 9 and the control device 6B when an output is acquired from the solar module 1A.

As illustrated in FIG. 9, the solar power generation system 100B starts from a fault determination process (S30). As the fault determination process (S30), the fault determination unit 9 determines whether or not at least one of the bypass diodes 12A to 12C has an open fault based on the measurement information.

When the fault determination unit 9 determines that at least one of the bypass diodes 12A to 12C has an open fault (YES in S30), the control device 6B sets the lower limit value of the target output voltage as a lower limit value setting process (S32). The control device 6B sets the lower limit value calculated by using General Formula (1) as the lower limit value of the target output voltage. Next, a target output voltage determination process (S34) is executed.

As the target output voltage determination process (S34), the control device 6B determines the target output voltage within a range greater than or equal to the lower limit value set in the lower limit value setting process (S32) such that the maximum output is acquired from the solar module 1A.

When the fault determination unit 9 determines that all of the bypass diodes 12A to 12C do not have an open fault (NO in S30), the control device 6B executes the target output voltage determination process (S34) without executing the lower limit value setting process (S32). As the target output voltage determination process (S34), the control device 6B determines the target output voltage without limitations on the voltage range such that the maximum output is acquired from the solar module 1A.

The solar power generation system 100B terminates the flowchart of the output determination process illustrated in FIG. 9 when the target output voltage determination process (S34) is terminated. When the target output voltage is dynamically set, the solar power generation system 100B executes the terminated flowchart of the output determination process again from the beginning. The process heretofore sets the lower limit value of the target output voltage when there is a possibility of satisfying the abnormal heat generation condition, and determines the target output voltage that is greater than or equal to the lower limit value.

Conclusion of Third Embodiment

The solar power generation system 100B according to the third embodiment heretofore sets the lower limit value of the target output voltage by using General Formula (1) when the fault determination unit 9 determines that at least one of the bypass diodes 12A to 12C has an open fault, that is, when there is a possibility of satisfying the abnormal heat generation condition. The solar power generation system 100B dynamically sets the lower limit value and thus, can reduce abnormal heat generation of the solar cells 10 by control and increase the total amount of power generated by the solar power generation system 100B.

The present disclosure is not limited to the embodiments. The present disclosure can be embodied in various forms that are achieved by carrying out various modifications or improvements to the embodiments based on the knowledge of those skilled in the art.

The control devices 6, 6A, 6B may not execute the MPPT control. For example, the control devices 6, 6A, 6B may execute a scanning control that scans a wide range of the voltage output from the solar modules 1, 1A to find the maximum value of power. In such a case as well, the action and the effect of the embodiments are achieved in the solar power generation systems 100, 100A, 100B.

What is claimed is:

1. A solar power generation system comprising:
a solar module in which a plurality of solar cells are connected in series;
a power converter connected to the solar module, the power converter being configured to control an output voltage of the solar module such that the output voltage matches a target output voltage; and
a control device configured to determine the target output voltage, the control device being configured to determine a lower limit value of the target output voltage based on a following general formula, $$V_{TL}(I_{rr}, T) = V_{OC}(I_{rr}, T) \cdot \frac{n-1}{n} - V_{BD}(T) - \alpha$$

where $I_{rr}$ denotes a used light intensity, T denotes a temperature, $V_{TL}(I_{rr}, T)$ denotes the lower limit value of the target output voltage under a certain used light intensity and a certain temperature, $V_{OC}(I_{rr}, T)$ denotes an open-circuit voltage of the solar module under a certain used light intensity and a certain temperature, n denotes the number of the solar cells connected in series, $V_{BD}(T)$ denotes a positive value of a reverse breakdown voltage of one of the solar cells at a certain temperature, and $\alpha$ denotes a tolerable error.

2. The solar power generation system according to claim 1, wherein:
the control device is configured to determine whether or not at least a part of the solar cells is shaded; and
the control device is configured to set the lower limit value of the target output voltage when the control device determines that at least a part of the solar cells is shaded.

3. The solar power generation system according to claim 1, further comprising:
a first diode; and
a second diode, wherein:
the solar cells include a first series solar cell group and a second series solar cell group;
the first diode and the first series solar cell group are connected in parallel with each other;
the second diode and the second series solar cell group are connected in parallel with each other;
the control device is configured to determine whether or not at least one of the first diode and the second diode has an open fault; and
the control device is configured to set the lower limit value of the target output voltage when the control device determines that at least one of the first diode and the second diode has an open fault.

4. The solar power generation system according to claim 2, further comprising an imaging device configured to acquire a captured image of a surface of the solar cells, wherein:
the control device is connected with the imaging device; and
the control device is configured to determine whether or not at least a part of the solar cells is shaded, based on the image acquired by the imaging device.

* * * * *